United States Patent
Falk et al.

(10) Patent No.: US 9,525,287 B2
(45) Date of Patent: Dec. 20, 2016

(54) INVERTER SYSTEM AND METHOD FOR OPERATION OF A PHOTOVOLTAIC INSTALLATION FOR FEEDING ELECTRICAL POWER INTO A MEDIUM-VOLTAGE POWER SUPPLY GRID

(71) Applicant: SMA Solar Technology AG, Niestetal (DE)

(72) Inventors: Andreas Falk, Kassel (DE); Aaron Philipp Gerdemann, Kassel (DE); Frank Niebling, Kaufungen (DE); Bernhard Beck, Volkbach-Dimbach (DE)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 889 days.

(21) Appl. No.: 13/888,482

(22) Filed: May 7, 2013

(65) Prior Publication Data
US 2013/0241297 A1 Sep. 19, 2013

Related U.S. Application Data

(63) Continuation of application No. PCT/EP2011/069453, filed on Nov. 4, 2011.

(30) Foreign Application Priority Data

Nov. 8, 2010 (DE) ........................ 10 2010 060 398

(51) Int. Cl.
*H02J 5/00* (2016.01)
*H02J 3/38* (2006.01)
*H01L 31/02* (2006.01)

(52) U.S. Cl.
CPC ........... *H02J 5/00* (2013.01); *H01L 31/02021* (2013.01); *H02J 3/383* (2013.01); *Y02E 10/563* (2013.01); *Y10T 307/696* (2015.04)

(58) Field of Classification Search
CPC ......... H02J 5/00; H02J 3/383; H01L 31/02021
(Continued)

(56) References Cited

U.S. PATENT DOCUMENTS 6,219,623 B1 4/2001 Wills
6,339,538 B1 1/2002 Handleman
(Continued)

FOREIGN PATENT DOCUMENTS

CN 200994112 Y 12/2007
CN 101765959 A 6/2010
(Continued)

OTHER PUBLICATIONS

Gurthmann, Otto, et al. "Manual of Practice for Switching Systems." Chapter 6.2: Switching Devices for Medium and High Voltage Systems. ISBN# 3-7736-0833-0. Published in 1977.
(Continued)

*Primary Examiner* — Joseph Chang
(74) *Attorney, Agent, or Firm* — Eschweiler & Associates, LLC

(57) ABSTRACT

The disclosure relates to a method for operation of a photovoltaic installation for feeding electrical power into a medium-voltage power supply grid, with the photovoltaic installation having a plurality of photovoltaic modules, at least one inverter and at least one medium-voltage transformer, and with the primary side of the medium-voltage transformer being connected directly to an alternating-current (AC) low-voltage output of the inverter, and at least one direct-current (DC) switching member being arranged between the photovoltaic modules and a DC input of the inverter. When the electrical power produced by the photovoltaic modules in the photovoltaic installation is not suf-
(Continued)

ficient for feeding electrical power into the supply grid, the photovoltaic modules are disconnected from an inverter on the DC voltage side while, in contrast, the inverter remains connected to the medium-voltage power supply grid on the AC voltage side by the medium-voltage transformer.

20 Claims, 3 Drawing Sheets

(58) Field of Classification Search
USPC .................................................. 307/80, 83
See application file for complete search history.

(56) References Cited

U.S. PATENT DOCUMENTS

| | | |
|---|---|---|
| 2005/0088868 A1 | 4/2005 | Ryan et al. |
| 2009/0236916 A1* | 9/2009 | Nishimura ............ H02J 7/35 307/80 |
| 2010/0001587 A1 | 1/2010 | Casey et al. |
| 2010/0139743 A1 | 6/2010 | Hadar et al. |
| 2010/0156188 A1 | 6/2010 | Fishman |
| 2010/0246223 A1 | 9/2010 | Xuan |

FOREIGN PATENT DOCUMENTS

| | | |
|---|---|---|
| CN | 101765965 A | 6/2010 |
| EP | 1870996 A1 | 12/2007 |
| EP | 1993184 A1 | 11/2008 |
| EP | 2242160 A1 | 10/2010 |
| JP | 61011443 A | 1/1986 |
| JP | H09135536 A | 5/1997 |
| JP | 2007274841 A | 10/2007 |
| JP | 4412413 B1 | 2/2010 |
| JP | 2010178611 A | 8/2010 |
| JP | 2010226950 A | 10/2010 |
| TW | 200903971 A | 1/2009 |
| WO | 2009014522 A1 | 1/2009 |

OTHER PUBLICATIONS

Collier, D.E., et al.; "Electrical Fault Protection for Large Photovoltaic Power Plant Inverter"; Photovoltaic Specialists Conference, 1998, Conference Record of the Twentieth IEEE.

West, R.; "Advanced, High-Reliability, System-Integrated 500kW PV Inverter Development"; Final Subcontract Report, Sep. 29, 2005-May 31, 2008; NREL/SR-520-43839 Aug. 2008; http://www.nrel.gov/docs/fy08osti/43839.pdf.

International Search Report for Application No. PCT/EP2011/069453 dated Apr. 3, 2012.

* cited by examiner

INVERTER SYSTEM AND METHOD FOR OPERATION OF A PHOTOVOLTAIC INSTALLATION FOR FEEDING ELECTRICAL POWER INTO A MEDIUM-VOLTAGE POWER SUPPLY GRID

REFERENCE TO RELATED APPLICATIONS

This application is a continuation application of International Patent Application No. PCT/EP2011/069453, filed on Nov. 4, 2011, which claims priority to German Patent Application No. 10 2010 060 398.8, filed on Nov. 8, 2010, the contents of which are hereby incorporated by reference in their entirety.

FIELD

The disclosure relates to a method for operation of a photovoltaic installation having a multiplicity of photovoltaic modules, at least one inverter and at least one medium-voltage transformer for feeding electrical power into a medium-voltage power supply grid. The disclosure also relates to a photovoltaic installation which is designed to carry out the method.

BACKGROUND

In the case of relatively large photovoltaic installations, in particular open-field plants, also called solar parks, the electrical power which is produced is generally fed directly into a medium-voltage power supply grid, for example a 20 kilovolt (kV) power supply grid. Such open-field plants generally have a multiplicity of photovoltaic modules, a plurality of which are connected in series to form so-called strings. A plurality of the strings are frequently connected together in order to supply the power produced by them in the form of direct current to one of possibly a plurality of inverters that are provided. On the output side, inverters are connected to a primary winding of a medium-voltage transformer. In this case, one medium-voltage transformer can be provided for each inverter, or a plurality of inverters can be connected to one medium-voltage transformer, possibly with separate primary windings. The power which is produced is fed, possibly by means of a coupling contactor, into the medium-voltage power supply grid by the output or outputs on the secondary side of the transformer.

A photovoltaic installation of this type, in which the inverters are connected directly to the medium-voltage transformers, is known from the article "*Enel's 3-MW Power Station Preliminary Design*", C. Corvi et al., 10th European Photovoltaic Solar Energy Conference, 1991. In this case, inverters are used which have inverter bridges which are fitted with thyristors. The inverters are commutated by the power supply grid, that is to say they draw the switching voltage, as well as the commutation voltage for the thyristors, from the electrical power supply grid.

Because of their relatively low efficiency, modern inverters with thyristor-fitted inverter bridges are still used only rarely. It is more common to use switching transistors in the inverter bridges, in order to allow the inverter to be operated by pulse-width modulation. In this case, the transistors used are generally IGBTs (Insulated Gate Bipolar Transistors) or MOSFETs (Metal-Oxide Semiconductor Field Effect Transistors). For protection against high voltages in the reverse-biased direction, these transistors are normally protected by a diode which is connected anti-parallel wise and which is forward-biased when the transistor is reverse-biased, and which is frequently already integrated in the transistor. These diodes, which are also referred to as freewheeling diodes, form a full-wave rectifier from the power supply grid connection to the DC (direct-current) voltage intermediate circuit of the inverter. When an AC (alternating-current) voltage is present on the power supply grid side of the inverter, but the photovoltaic modules are not producing an adequate voltage, a reverse current flow occurs by the freewheeling diodes through the photovoltaic modules, with power being consumed from the AC voltage power supply grid.

In order to prevent such a reverse current flow, it is known for the inverters each to be connected to the medium-voltage transformers by an AC low-voltage contactor. The AC low-voltage contactors are used to disconnect the inverter from the power supply grid when there is no incident solar radiation, or when this is inadequate, thus preventing a reverse current flow through the photovoltaic modules, with power being consumed from the power supply grid.

In addition, the AC low-voltage contactors can be used to decouple the respective inverter selectively from the medium-voltage transformer in the event of an overcurrent or short circuit, if the required power supply grid parameters are infringed (voltage, frequency, reactive power feeding, etc.), or if an inverter fails. However, fitting every inverter with an associated AC low-voltage contactor and a monitoring device for compliance with the power supply grid feed parameters is complex and costly.

Furthermore, it is known to use an AC contactor located between a medium-voltage transformer and the power-supply grid for fault protection, as for example described in the article "*Electrical fault protection for a large photovoltaic power plant inverter*", by Collier and Key, Photovoltaic Specialists Conference Record, IEEE, 1988. According to this document, the AC contactor is operated in case of a fault after DC connectors have decoupled the photovoltaic modules from the inverter.

SUMMARY

The present disclosure is directed to a method for operating a photovoltaic installation of the type mentioned initially for feeding electrical power into a medium-voltage power supply grid and a corresponding photovoltaic installation, in which the photovoltaic modules are disconnected from the power supply grid and reverse current protection is provided in a less complex manner.

In the method for operation of a photovoltaic installation for feeding electrical power into a medium-voltage power supply grid, the photovoltaic installation has a multiplicity of photovoltaic modules, at least one inverter and at least one medium-voltage transformer. In this case, the primary side of the medium-voltage transformer is connected directly to an AC low-voltage output of the inverter, and at least one DC switching member is arranged between the photovoltaic modules and a DC input of the inverter. The method is distinguished in that, when the electrical power produced by the photovoltaic modules in the photovoltaic installation is not sufficient for feeding electrical power into the power supply grid, the photovoltaic modules are disconnected from an inverter on the DC voltage side while, in contrast, the inverter remains connected to the medium-voltage power supply grid on the AC voltage side by the medium-voltage transformer.

Directly linking the medium-voltage transformer to the inverter avoids the need for the costly AC low-voltage contactor on the primary side between the inverter and the medium-voltage transformer. If the photovoltaic modules cannot produce sufficient electrical power for feeding in, the DC switching member is used to prevent a reverse current flow through the photovoltaic modules.

In one variant of the method, the photovoltaic installation is disconnected from the medium-voltage power supply grid on the secondary side of the medium-voltage transformer, with the aid of a coupling contactor which is arranged between the medium-voltage transformer and the medium-voltage power supply grid, when predetermined power supply grid feed parameters are not satisfied.

In one embodiment the tasks of the AC low-voltage contactor on the primary side are carried out jointly by the DC switching member and the medium-voltage coupling contactor. The DC switching member is used to prevent a reverse current flow through the photovoltaic modules, and the coupling contactor is used for disconnection from the medium-voltage power supply grid when the power supply grid parameters are not being complied with. Particularly in the case of relatively large installations having a plurality of inverters, this results in an advantage since, in comparison to installations according to the prior art, it is possible to save an AC low-voltage contactor in each inverter and, instead, only one common coupling contactor is required for all the inverters.

BRIEF DESCRIPTION OF THE DRAWINGS

The disclosure will be explained in more detail in the following text using one example embodiment and with the aid of three figures, in which.

DETAILED DESCRIPTION

Figure 1:
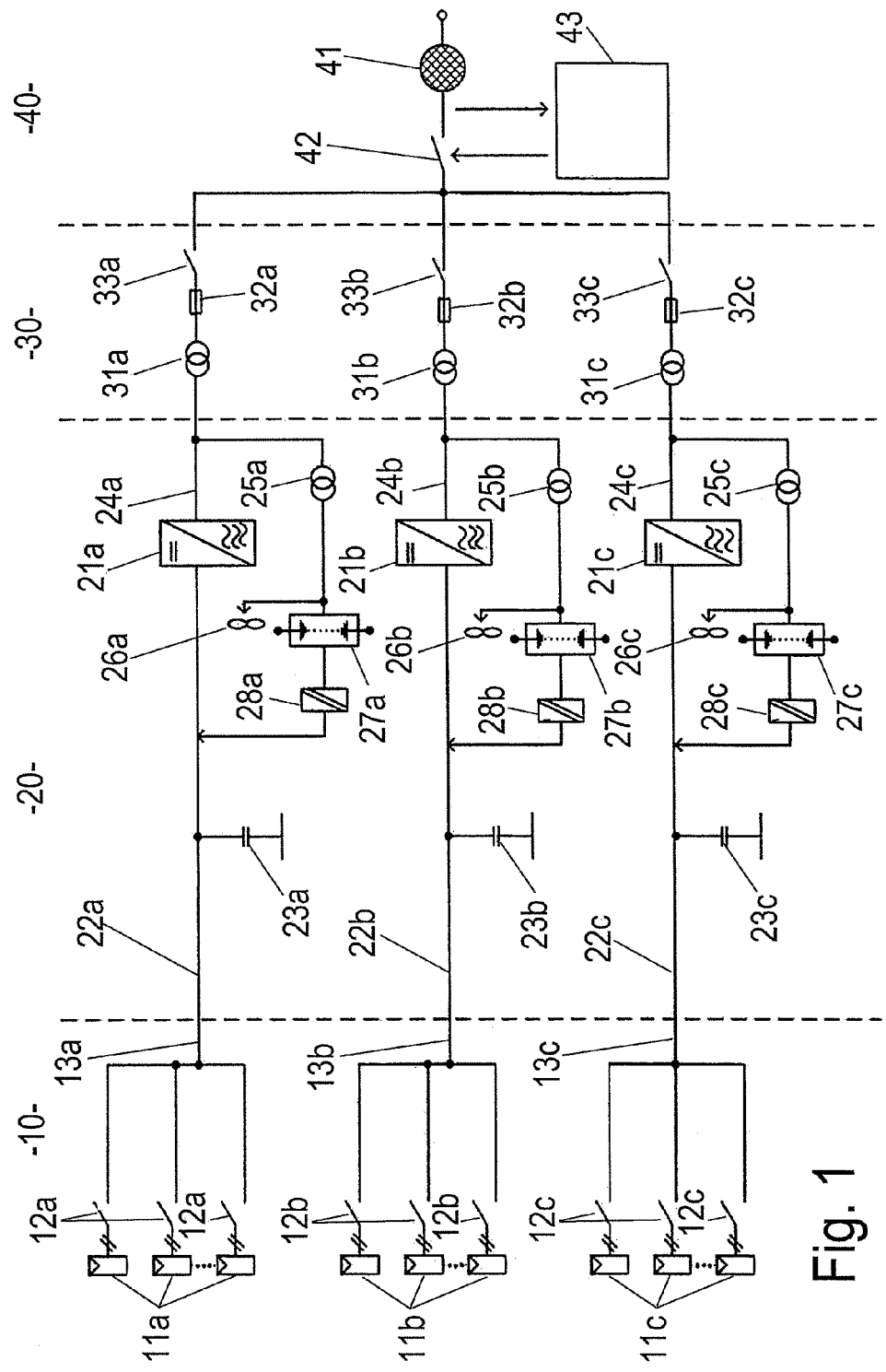
FIG. 1 shows a photovoltaic installation for connection to a medium-voltage power supply grid.

The photovoltaic installation illustrated in FIG. 1 is subdivided schematically into four sections: a photovoltaic generator 10, an inverter arrangement 20, medium-voltage components 30 and a section 40 for linking to a power supply grid.

The section 40 for linking to the power supply grid is included once in the photovoltaic installation. The other sections 10, 20, 30 each have a plurality of independent branches, three in the example in FIG. 1, which are each of identical design. In FIG. 1, the components of the individual branches a, b, c are distinguished from one another by means of a suffix a, b, c attached to the respective reference symbol of the components. When a reference symbol is used without a suffix such as this in the following text, it relates either to all the corresponding components jointly or to a component which is not specified in any more detail, in which case the association with one of the branches is irrelevant. The number of three branches in the photovoltaic installation is in this case purely an example, and is not restrictive. The disclosure can be used for photovoltaic installations having any desired number of branches.

The photovoltaic generator 10 has a multiplicity of photovoltaic modules 11, a plurality of which in each case may be connected to one another to form a partial generator. For this purpose, a plurality of photovoltaic modules 11 may, for example, be connected in series to form strings, and a plurality of strings connected in parallel form the partial generator. Only one photovoltaic module 11 is illustrated symbolically for each partial generator in the figure. A DC switching member 12, for example a contactor, is associated with each partial generator. For simplicity, the direct-current switching member 12 is referred to by way of example in the following text as a direct-current (DC) contactor 12.

All the partial generators in a branch a, b or c can be connected together by the DC contactors 12 in parallel to an output 13a, b, c of the branch. By way of example, FIG. 1 shows three partial generators for each branch. This number is also not restrictive. As is indicated by the dots in the figure, a far larger number of partial generators are normally provided in each branch. The interconnection of the individual photovoltaic modules 11 to form strings and their interconnection in parallel to form partial generators are also only an example. Other combinations of series and/or parallel circuits of the photovoltaic modules 11, by means of which the power which is produced by the photovoltaic modules 11 is combined in each case at one output 13 for each branch, are likewise feasible. As an alternative to fit each partial generator with a DC contactor 12 as shown, it is also possible for one DC contactor 12 to be associated with one group of interconnected partial generators. For the operation of the DC contactors that is relevant for the purposes of the application, it would be sufficient if there were one DC contactor 12 for each group a, b, c used to switch the corresponding output 13. The important factor is that there is a possibility to disconnect all the photovoltaic modules 11 on the DC side of the photovoltaic generator from the inverter arrangement 20.

Within the inverter arrangement 20, each branch a, b, c has an inverter 21 with a DC input 22, which is connected to the respective output 13a, b, c of the photovoltaic generator 10. The input circuit of an inverter is also referred to as a DC-voltage intermediate circuit. The voltage which is applied to the DC input 22 is correspondingly also referred to as the intermediate circuit voltage Uz. The intermediate circuit voltage Uz is typically at the optimum operating point, at which the respective part of the photovoltaic generator 10 emits the maximum electrical power in instantaneous (actual) operating conditions, at about 500-1000 V. The DC voltage intermediate circuit is pulse-loaded by the inverter 21. An intermediate circuit capacitor 23, which provides an intermediate circuit capacitance, is provided in order to smooth the intermediate circuit voltage Uz and to maintain the optimum operating point. The intermediate circuit capacitor 23 is illustrated separately in FIG. 1, but is frequently integrated in the inverter.

Furthermore, an auxiliary transformer 25, auxiliary components 26, a buffer battery 27 and a precharging device 28 are also provided in each of the branches within the inverter arrangement 20. The auxiliary transformer 25 is used to supply power to the auxiliary components 26. The auxiliary components are typically supplied with direct current. For simplicity reasons, the figure does not show a corresponding rectifier and control circuit. By way of example, a fan is shown as an auxiliary component 26 in the figure. Further auxiliary components are monitoring devices and devices for controlling the respective inverter 21, as well as for data acquisition and remote data transmission. Furthermore, the voltage which has been transformed down by the auxiliary transformer 25 is used to charge or to maintain the charge in the buffer battery 27. This function of the buffer battery 27 and of the precharging device 28 will be explained in more detail further below.

Each of the inverters 21 has an AC output 24, which is connected, with normally three phases, directly to a primary side of a medium-voltage transformer 31 for feeding into a medium-voltage power supply grid 41. In this case, direct means in particular that no switching member which can be operated or closed automatically is provided between the inverter 21 and the medium-voltage transformer 31. In contrast, for the purposes of the application, the term is intended to directly cover a connection with the interposition of a fuse, a disconnector or some other protection number, which can provide automatic disconnection, but not reconnection. In the case of a photovoltaic installation according to the application, no switching member which is suitable for regular and non-manual disconnection of the medium-voltage transformer from the inverter, and for reconnection of the medium-voltage transformer to the inverter, is therefore provided on the primary side (that is to say the low-voltage side) between the inverter and the medium-voltage transformer. A disconnection, protection or fuse member which is opened as a function of a fault or can be opened manually, for example for maintenance purposes, and can be closed again manually, may in contrast be provided.

It is assumed that the inverters 21 have inverter bridges with transistors, for example with IGBTs or MOSFETs, which are protected against excessively high reverse voltages by feeding in freewheeling diodes connected back-to-back in parallel. These freewheeling diodes form a full-wave rectifier for the AC voltage which is produced at the AC outputs 24. Furthermore, the inverters 21 are self-commutating. They are commutated by switching the transistors, which are used as switches, off and on.

In the illustrated example, one and only one medium-voltage transformer 31a, b, c is provided for each inverter 21a, b, c. However, it is also feasible for two or more inverters to lead to one medium-voltage transformer, which may be equipped with a plurality of primary windings.

The rating of the medium-voltage transformer 31 is in the range from 1 to 1.5 Megavolt-amperes (MVA) in one embodiment. This corresponds to currents in the intermediate circuit that can still be transmitted with the intermediate circuit voltage of 500-1000 V, as mentioned above, with reasonable line cross sections and without excessive resistive losses. At the same time, the rating range allows an open-field installation to be designed without the number of parallel branches each having their own inverter 21 and medium-voltage transformer 31 being too great, and the design therefore being uneconomic.

A protection member 32 and a switch disconnector 33 are associated with each medium-voltage transformer 31, and are connected in series with the respective secondary winding of the medium-voltage transformers 31.

By way of example, an inert fuse link can be used as the protection member 32, which blows both in the event of overcurrent and in the event of a short circuit. If one and only one inverter is associated with each medium-voltage transformer—as in the illustrated example—the protection member 32 protects both the medium-voltage transformer and the inverter against overcurrent.

In one embodiment a spring energy store disconnector with manual pull-in and electromagnetic tripping is used as the switch disconnector 33. The tripping mechanism is in this case connected to a fault monitoring device for the respective inverter 21, such that the switch disconnector 33 automatically selectively disconnects the appropriate branch from the medium-voltage power supply grid 41 in the event of a fault. Manual disconnection may also be used, of course, if required, for example for maintenance work. A spring energy store disconnector with manual pull-in is sufficient in this case, and is advantageous with regard to powered pull-in for cost reasons, in particular since the switch disconnector 33 is not operated during normal operation of the photovoltaic installation, as will be described in more detail further below.

In order to feed the electrical power which is produced into the medium-voltage power supply grid 41, the secondary circuits, which are protected individually by the protection members 32 and the switch disconnector 33, are jointly connected by one coupling contactor 42 to the medium-voltage power supply grid 41. The coupling contactor 42 is operated by a monitoring device 43, which checks whether tolerance limits specified for the medium-voltage power supply grid 41 for parameters such as voltage amplitude, phase angle, reactive power, frequency, etc. are being complied with. If one of these parameters departs from the specified tolerance range, the coupling contactor 42 disconnects the photovoltaic installation from the medium-voltage power supply grid 41.

Methods for operation of a photovoltaic installation will be described in the following text, with reference to flowcharts in FIGS. 2 and 3. The methods may be carried out, for example, in conjunction with the variant of a photovoltaic installation illustrated in FIG. 1. The reference symbols used relate to FIG. 1.

Figure 2:
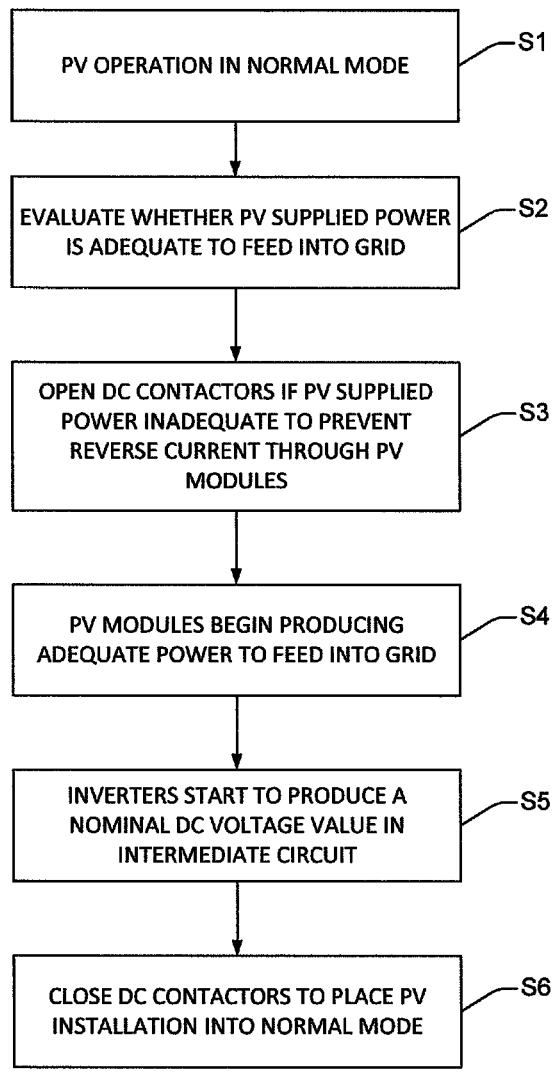
FIG. 2 shows a flowchart of one example embodiment of a method for operating a photovoltaic installation.

First of all, the photovoltaic installation is operated in the normal mode at S1 (FIG. 2). In this case, the photovoltaic modules 11 in the area of the photovoltaic generator 10 produce sufficient electrical power to feed into the medium-voltage power supply grid 41, because the incident solar radiation is adequate.

In the normal mode, the DC contactors 12 are closed and the inverters 21 are clocked, in order to convert electrical power from direct current to alternating current. The intermediate circuit is operated at an optimum operating-point voltage. Means for adjusting and tracking the optimum operating point are normally provided in the respective inverter 21 (MPP Tracking-Maximum Power Point Tracking). The intermediate circuit capacitor 23 is charged corresponding to the voltage Uz in the intermediate circuit. Furthermore, both the switch disconnectors 33 in the individual branches a, b, c in the photovoltaic installation and the common coupling contactor 42 are closed, as a result of which all the inverters 21 feed into the medium-voltage power supply grid 41 via the corresponding medium-voltage transformers 31.

Power is drawn at the AC output 24 of each inverter 21 by the auxiliary transformer 25, and is used to supply the auxiliary components 26. The voltage produced by the auxiliary transformer 25 is also used to charge or to maintain the charge in the buffer battery 27. The precharging device 28 is not active in the normal mode.

When the electrical power produced by the photovoltaic modules 11 is no longer adequate for feeding into the medium-voltage power supply grid 41, for example at night or when completely shadowed (at S2), the DC contactors 12a, b, c are opened in a subsequent act S3 by a control device, which is not illustrated in the figure, in order to prevent a reverse current flow through the photovoltaic modules 11. In this case, the DC contactors 12 for the individual branches a, b, c may be switched selectively, since the incident-radiation conditions may not be the same for all the photovoltaic modules 11, in the various branches a, b, c. The possibility of selective switching also allows faulty branches a, b, c to be disconnected.

The switch disconnectors 33 and the coupling contactor 42 remain closed, as a result of which all the inverters 21, including those whose associated DC contactors 12a, b, c are opened, are indirectly coupled by their respective AC output 24 via the medium-voltage transformers 31 to the medium-voltage power supply grid 41. In this case, the inverters 21 are not clocked.

In that case, the auxiliary components 26 are supplied with power from the medium-voltage power supply grid 41 by the auxiliary transformer 25. Because of the intermediate circuit capacitance of the intermediate circuit capacitor 23, the intermediate circuit voltage Uz is initially maintained. Since the operating voltage in the intermediate circuit is normally greater than the peak voltage of the AC voltage which is produced at the AC output 24 of the inverter 21, the intermediate circuit voltage Uz falls to this peak value of the AC voltage, with a time constant in the region of minutes, for example.

When the photovoltaic modules 11 are once again producing power after the incident radiation has started again (at S4), the inverters 21 start to clock in at S5, and produce a desired DC voltage nominal value in the respective DC voltage intermediate circuits. The DC contactors 12 are subsequently switched on in at S6, and the photovoltaic installation is once again in the normal mode.

Figure 3:
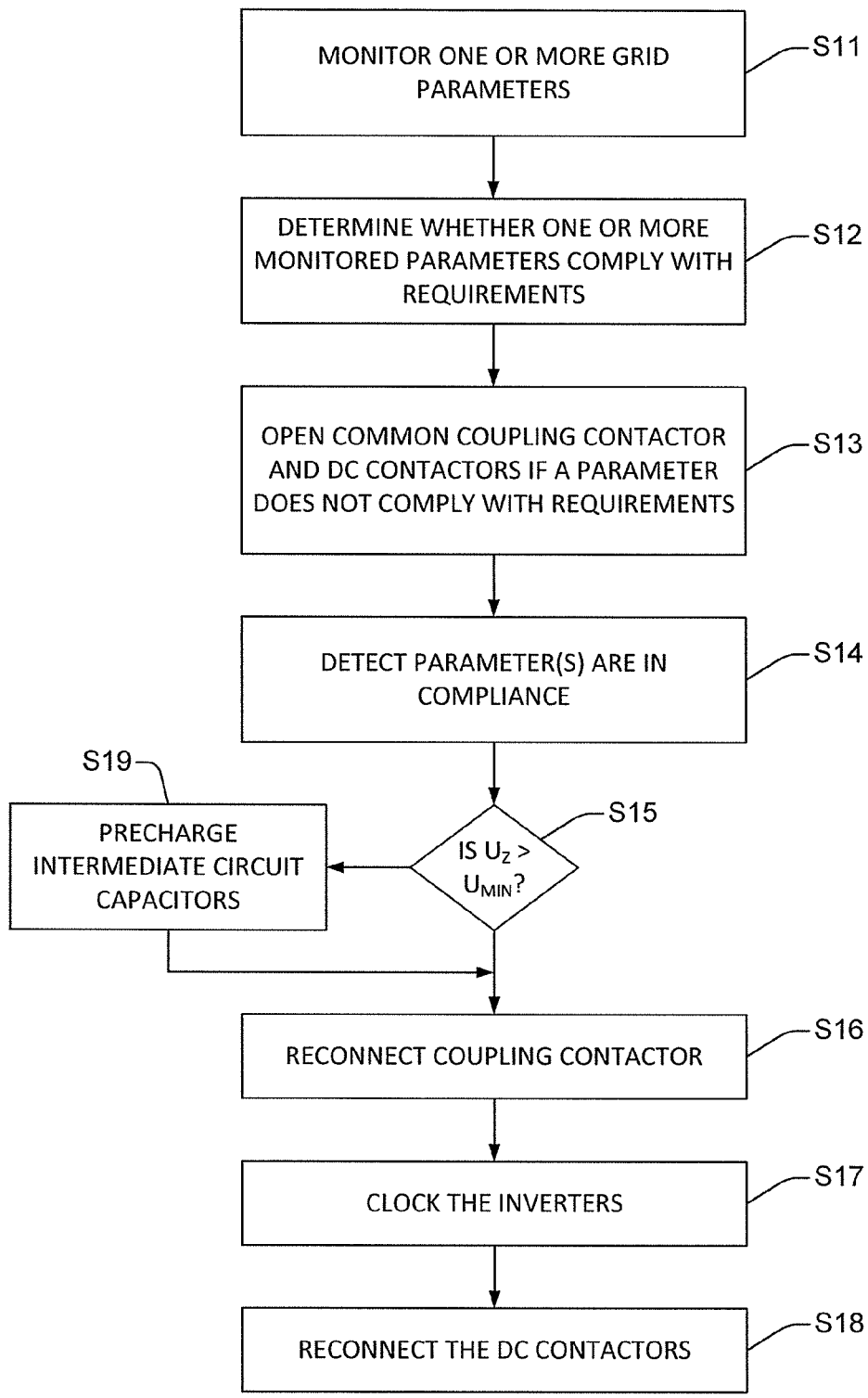
FIG. 3 shows a flowchart of a further example embodiment of a method for operating a photovoltaic installation.

FIG. 3 illustrates a development of the method for operating a photovoltaic installation. During the normal mode, the monitoring device 43 monitors, at S11, whether relevant power supply grid parameters at the point where the electricity that is produced is fed into the medium-voltage power supply grid 41 comply with the requirements of the power supply grid operators, for example with respect to the voltage, the frequency or the reactive power which is fed in.

If one or more of these parameters departs from the specified tolerance range at S12, the monitoring device 43 opens the coupling contactor 42 at S13. The DC contactors 12 are opened at the same time, since an operating point can be set only when power is being drawn. If the coupling contactor 42 were to be opened, the intermediate circuit voltage would therefore rise in the direction of the open circuit voltage of the photovoltaic modules 11, which will be undesirable, because the inverter is normally not designed to have a voltage applied to it in the long term as high as the open circuit voltage of the photovoltaic modules 11.

If the monitoring device 43 detects that the power supply grid feed parameters are once again in the tolerance range at S14, a check is first of all carried out at S15 to determine whether the intermediate circuit voltages Uz are each above a predetermined minimum voltage Umin. By way of example, the minimum voltage Umin may be in the region of 30% to 70% of the intermediate circuit voltage during operation. If the interruption time in which the coupling contactor 42 was opened was short, for example shorter than a minute, the capacitance of the intermediate circuit capacitors 23 would result in the intermediate circuit voltages not yet having fallen below the minimum voltage Umin.

If it was found at S15 that the respective intermediate circuit voltage Uz was above the minimum voltage Umin (YES at S15) and the interruption time was in consequence not too long, the coupling contact 42 is reconnected at S16, without any risk of high reverse current flowing by the medium-voltage transformers 31 and the inverters 21 into the intermediate circuit capacitors 23. After reconnection of the coupling contactor 42, the inverters 21 are clocked again at S17, in order to change the intermediate circuit voltage to the desired nominal value. The DC contactors 12 are then reconnected at S18.

However, if the opening time of the coupling contactor 42 has lasted for an excessively long time and the voltage Uz in the DC voltage intermediate circuits has fallen below the minimum voltage Umin (NO at S15), it would not be possible to preclude overcurrents occurring if the coupling contactor 42 are to be reconnected immediately. In this case, the intermediate circuit capacitors 23 are first of all precharged, at S19, by the corresponding precharging devices 28 from the respective buffer battery 27 to a predetermined nominal value, which is greater than or equal to the minimum voltage Umin. Only after this the method continues with the acts S16 to S18 in which, as already described, the coupling contactor 42 is closed, the inverters 21 are clocked, and the DC contactors 12 are closed. The precharging device may, for example, be in the form of a step-up controller. Furthermore, galvanic isolation may be provided between the DC voltage intermediate circuit and the buffer battery 27 in the precharging device.

As an alternative to the design shown in FIG. 1, the intermediate circuits may also be precharged from a central buffer battery. In this case, the auxiliary components 26 are also supplied in a corresponding manner from the central buffer battery. In order to minimize resistive losses in the current distribution when using a central buffer battery such as this, this central buffer battery may have a relatively high voltage of 110 V, for example. In contrast, lower voltages are advantageous for the local buffer batteries 27, for example 24 V. If required, a central precharging device may also be provided, which can be connected to the appropriate intermediate circuits as required.

For maintenance work or when it is necessary to replace one of the inverters 21 or one of the medium-voltage transformers 31, the appropriate branch of the photovoltaic installation is decoupled by the associated switch disconnector 33. As described above, in the case of an electromagnetically tripped switch disconnector 33, this decoupling can also be carried out by means of a fault monitoring device for the respective inverter 21. Since the events which lead to operation of the switch disconnector 33 should occur rarely, because of their nature, a spring energy store disconnector with manual pull-in can be used as the switch disconnector 33.

A branch of the photovoltaic installation which has been decoupled by the switch disconnector 33 in this way is restarted analogously to the reconnection of the photovoltaic installation via the coupling contactor 42, as described above. Therefore, the intermediate circuit capacitor 23 is correspondingly charged via the precharging device 28 before the reconnection of a disconnected switch disconnector 33.

In consequence, the DC switching members 12 are switched regularly during operation of the photovoltaic installation in the methods described above. Corresponding to the frequency of the events on which the switching processes are based (change between day and night, complete shadowing), they are therefore designed for frequent switching cycles in one embodiment. They are particularly designed for more than 20,000 switching cycles in one embodiment. This number of switching cycles results from a projected life of 20 years for a photovoltaic installation and an assumption of about three switching cycles per day for the events on which the switching processes are based.

In addition to the described purpose, DC switching members 12 can also be used for other purposes within the scope of the methods according to the disclosure, for example for disconnection of individual faulty screens or as fire-protection disconnectors. For these purposes, it is actually known for photovoltaic installations to be provided as switching members between the photovoltaic modules and an inverter. The DC switching members 12 used for the purposes of the present application differ from these not only by their purpose but by their capability to be switched regularly.

A similar situation also applies to the coupling contactor 42, since the occurrence of impermissible power supply grid feed parameters is once again not a rare event. The coupling contactor 42 is therefore also designed for carrying out a large number of switching cycles in one embodiment, and particularly designed for carrying out the large number of switching cycles, in particular more than 20,000 switching cycles, without faults being present in one embodiment. The coupling contactor 42 can also, of course, be used for purposes other than those described above, for example for complete disconnection of the photovoltaic installation from the power supply grid, for maintenance purposes. Once again, the coupling contactor 42 according to the application differs from the known installation disconnectors, apart from its purpose in the course of the methods according to the invention, by its capability to be switched regularly.

The invention claimed is:

1. A method for operating a photovoltaic installation for feeding electrical power into a medium-voltage power supply grid, with the photovoltaic installation having a plurality of photovoltaic modules, an inverter and a medium-voltage transformer, wherein a primary side of the medium-voltage transformer is connected directly to an AC low-voltage output of the inverter, and wherein at least one DC switching member is arranged between the photovoltaic modules and a DC input of the inverter, comprising:
   determining whether or not electrical power produced by the photovoltaic modules in the photovoltaic installation is sufficient for feeding electrical power into the supply grid; and
   when the electrical power produced by the photovoltaic modules is not sufficient for feeding electrical power into the supply grid, disconnecting the photovoltaic modules from the inverter on the DC voltage side via the at least one DC switching member while the inverter remains connected to the medium-voltage power supply grid on the AC voltage side via the medium-voltage transformer.

2. The method according to claim 1, further comprising disconnecting the photovoltaic installation from the medium-voltage power supply grid on a secondary side of the medium-voltage transformer by opening a coupling contactor which is arranged between the medium-voltage transformer and the medium-voltage power supply grid, when predetermined requirements for one or more power supply grid feed parameters are not satisfied.

3. The method according to claim 2, wherein the one or more power supply grid feed parameters relate to a voltage amplitude and/or a frequency of the medium-voltage power supply grid and/or to a reactive power that is fed in to the medium-voltage power supply grid.

4. A photovoltaic installation having a plurality of photovoltaic modules, an inverter and a medium-voltage transformer, a primary side of a medium-voltage transformer connected directly to an AC low-voltage output of the inverter, and a second side configured to be coupled to a supply grid, and at least one DC switching member arranged between the photovoltaic modules and a DC input of the inverter, the installation configured to perform a method, comprising:
   determining whether or not electrical power produced by the photovoltaic modules in the photovoltaic installation is sufficient for feeding electrical power into a supply grid; and
   when the electrical power produced by the photovoltaic modules is not sufficient for feeding electrical power into the supply grid, disconnecting the photovoltaic modules from the inverter on the DC voltage side via the at least one DC switching member while the inverter remains connected to the supply grid on the AC voltage side via the medium-voltage transformer.

5. An inverter system, comprising:
   an inverter component configured to receive a DC input signal at a DC input side thereof, and generate an AC output signal at an AC output side thereof;
   a transformer having a primary side input directly connected to the AC output side of the inverter component, wherein the transformer is configured to couple to a power supply grid at a second side output thereof; and
   a DC switching member coupled to the DC input side of the inverter component, and configured to couple to one or more photovoltaic modules in a photovoltaic installation, wherein the DC switching member is configured to disconnect the one or more photovoltaic modules in the photovoltaic installation from the DC input side of the inverter component when an electrical power produced by the one or more photovoltaic modules is not sufficient to feed the electrical power to the power supply grid,
   wherein the DC switching member is configured to disconnect the one or more photovoltaic modules from the DC input side of the inverter component while the inverter component remains connected to the power supply grid via the transformer.

6. The inverter system according to claim 5, wherein no switching member configured to be driven or closed automatically is provided in the connection between the transformer and the AC output side of the inverter component.

7. The inverter system according to claim 5, wherein the inverter component comprises a bridge circuit comprising switching transistors.

8. The inverter system according to claim 7, wherein the bridge circuit of the inverter component comprises freewheeling diodes arranged back-to-back in parallel with the switching transistors.

9. The inverter system according to claim 5, further comprising a coupling contactor arranged between the secondary side output of the transformer and the power supply grid.

10. The inverter system according to claim 9, further comprising at least two transformers provided and connected to one another on the secondary sides thereof, upstream of the coupling contactor in a power flow direction while feeding in, wherein the coupling contactor is configured to jointly disconnect the two transformers from the power supply grid, or connect them thereto, during a switching process.

11. The inverter system according to claim 10, further comprising a monitoring device configured to monitor power supply grid feed parameters related to a current which is produced by the photovoltaic modules, wherein the monitoring device is connected to the coupling contactor, and interacts with the coupling contactor.

12. The inverter system according to claim 5, further comprising a protection member provided on the secondary side of the transformer.

13. The inverter system according to claim 5, further comprising a switch disconnector provided on the secondary side of the transformer.

14. The inverter system according to claim 13, wherein the switch disconnector comprises a spring energy store disconnector that does not reconnect in an automated fashion.

15. The inverter system according to claim 10, wherein the DC switching member and/or the coupling contactor are/is designed for more than 20 000 switching processes.

16. The inverter system according to claim 5, wherein the inverter component is designed for powers of more than 100 kW.

17. The inverter system according to claim 5, further comprising a precharging device configured to apply a predetermined voltage to a DC voltage intermediate circuit at a DC input side of the inverter component.

18. The inverter system according to claim 17, further comprising a buffer battery configured to supply the precharging device while the one or more photovoltaic modules are disconnected from the power supply grid.

19. The inverter system of claim 5 further comprising one or more auxiliary components arranged in a parallel path with respect to the inverter component, and wherein when the DC switching member disconnects the one or more photovoltaic modules from the DC input side of the transformer, electrical power from the power supply grid flows through the transformer to supply power to the auxiliary components.

20. The inverter system of claim 10 wherein when the coupling contactor jointly disconnects the two transformers from the power supply grid electrical power from the power supply grid does not flow through the transformer to supply power to auxiliary components arranged in a parallel path with respect to the inverter component.

* * * * *